US010437691B1

(12) United States Patent
Barhate et al.

(10) Patent No.: US 10,437,691 B1
(45) Date of Patent: Oct. 8, 2019

(54) SYSTEMS AND METHODS FOR CACHING IN AN ERASURE-CODED SYSTEM

(71) Applicant: Veritas Technologies LLC, Mountain View, CA (US)

(72) Inventors: Deodatta Barhate, Pune (IN); Sushrut Gajbhiye, Pune (IN); Aniruddha Gokhale, Pune (IN)

(73) Assignee: Veritas Technologies LLC, Santa Clara, CA (US)

( * ) Notice: Subject to any disclaimer, the term of this patent is extended or adjusted under 35 U.S.C. 154(b) by 164 days.

(21) Appl. No.: 15/472,271

(22) Filed: Mar. 29, 2017

(51) Int. Cl.
| G06F 11/00 | (2006.01) |
| G06F 11/20 | (2006.01) |
| G06F 3/06 | (2006.01) |
| G06F 11/10 | (2006.01) |
| H03M 13/15 | (2006.01) |
| H03M 13/00 | (2006.01) |

(52) U.S. Cl.
CPC .......... *G06F 11/2094* (2013.01); *G06F 3/061* (2013.01); *G06F 3/0619* (2013.01); *G06F 3/0644* (2013.01); *G06F 3/0683* (2013.01); *G06F 11/1076* (2013.01); *H03M 13/154* (2013.01); *H03M 13/1515* (2013.01); *H03M 13/6502* (2013.01); *G06F 2201/81* (2013.01); *G06F 2201/85* (2013.01)

(58) Field of Classification Search
CPC ........... G06F 11/1076; H03M 13/1515; H03M 13/154
See application file for complete search history.

(56) References Cited

U.S. PATENT DOCUMENTS

| 4,916,605 A * | 4/1990 | Beardsley | G06F 11/1666 701/18 |
| 5,636,359 A * | 6/1997 | Beardsley | G06F 12/0866 711/122 |
| 5,956,750 A * | 9/1999 | Yamamoto | G06F 3/0605 711/112 |
| 7,680,982 B2 * | 3/2010 | Ash | G06F 11/2092 711/113 |
| 7,725,655 B2 * | 5/2010 | Frolund | G06F 11/1064 707/674 |

(Continued)

OTHER PUBLICATIONS

Cheng Huang, Huseyin Simitci et al., USENIX ATC 2012, "Erasure Coding in Windows azure storage".

(Continued)

*Primary Examiner* — Marc Duncan
*Assistant Examiner* — Jonathan D Gibson
(74) *Attorney, Agent, or Firm* — FisherBroyles, LLP

(57) ABSTRACT

The disclosed computer-implemented method for caching in an erasure-coded system may include partitioning data into data chunks and storing the data chunks across at least two data storage devices. The method may also include encoding the data chunks into at least one parity chunk and storing the at least one parity chunk on at least one parity storage device. The method may further include caching (parity and/or data functions) to at least one storage device, when a threshold value is reached. The method may include detecting a storage failure on one of the data storage devices and subsequent thereto, prioritizing the caching of certain functions over those of others. Various other methods, systems, and computer-readable media are also disclosed.

20 Claims, 7 Drawing Sheets

(56) References Cited

U.S. PATENT DOCUMENTS

| | | | |
|---|---|---|---|
| 8,812,899 B1* | 8/2014 | Fultz | G06F 12/0886 714/6.1 |
| 9,684,686 B1* | 6/2017 | Morley | G06F 11/1469 |
| 9,690,657 B2* | 6/2017 | Iliadis | G06F 11/1076 |
| 10,120,757 B2* | 11/2018 | Gray | G06F 3/0619 |
| 2003/0093647 A1* | 5/2003 | Mogi | G06F 16/24552 712/1 |
| 2004/0059870 A1* | 3/2004 | Ash | G06F 11/1666 711/119 |
| 2005/0050381 A1* | 3/2005 | Maddock | G06F 11/1076 714/5.11 |
| 2005/0114728 A1* | 5/2005 | Aizawa | G06F 11/008 714/6.32 |
| 2005/0193242 A1* | 9/2005 | Ash | G06F 11/1441 714/6.13 |
| 2006/0174063 A1* | 8/2006 | Soules | G06F 12/0862 711/118 |
| 2006/0212748 A1* | 9/2006 | Mochizuki | G06F 11/1092 714/6.11 |
| 2007/0101187 A1* | 5/2007 | Daikokuya | G06F 11/1076 714/6.22 |
| 2007/0179994 A1* | 8/2007 | Deguchi | G06F 11/1471 |
| 2007/0226533 A1* | 9/2007 | Hafner | G06F 11/1088 714/6.22 |
| 2008/0126844 A1* | 5/2008 | Morita | G06F 11/1662 714/6.22 |
| 2008/0201523 A1* | 8/2008 | Ash | G06F 11/2092 711/113 |
| 2011/0179188 A1* | 7/2011 | Nakagawa | G06F 3/0613 709/240 |
| 2013/0173956 A1* | 7/2013 | Anderson | G06F 11/1076 714/6.24 |
| 2013/0173996 A1* | 7/2013 | Anderson | H03M 13/6502 714/770 |
| 2013/0198459 A1* | 8/2013 | Joshi | G06F 12/084 711/130 |
| 2014/0068183 A1* | 3/2014 | Joshi | G06F 12/0866 711/114 |
| 2014/0281265 A1* | 9/2014 | Atkisson | G06F 12/0802 711/136 |
| 2015/0100860 A1* | 4/2015 | Lee | H03M 13/373 714/786 |
| 2015/0146322 A1* | 5/2015 | Bi | G11B 19/2009 360/99.08 |
| 2015/0222705 A1* | 8/2015 | Stephens | G06F 3/0611 709/214 |
| 2017/0249084 A1* | 8/2017 | Gray | G06F 3/0619 |
| 2018/0060242 A1* | 3/2018 | Raghunath | G06F 12/0888 |
| 2018/0217906 A1* | 8/2018 | Jin | G06F 11/1088 |

OTHER PUBLICATIONS

Samuel Just, Linux Foundation, CEPH "Erasure Coding and Cache Tiering".

* cited by examiner ant disclosure describes various systems and methods for caching in an erasure-coded system by partitioning data into data chunks, storing the data chunks over multiple storage devices and caching data reads to the storage devices during normal operation, encoding the data into a parity chunk and storing the parity chunk on a storage device, detecting a failure in a data storage device, and prioritizing caching of the data reads to a failed data storage device over data reads to a storage device that has not failed.

In one or more examples, a system is provided for caching in an erasure-coded system. The system may include several modules stored in memory, a cache, and multiple storage devices. The system may also include (1) a partitioning module that partitions data into data chunks and stores the partitioned data chunks across at least two data storage devices, (2) an encoding module that encodes the partitioned data chunks into a parity chunk and stores the parity chunk on one or more parity storage devices, (3) a storage failure detection module that detects a storage failure on one or more of the data storage devices, (4) a caching module that caches to one or more of the storage devices when a threshold value is reached and which, subsequent to the storage failure detection module detecting the storage failure, prioritizes the caching of certain functions over other functions, and (5) a physical processor that executes the partitioning module, the encoding module, the caching module and the storage failure detection module.

The caching module may include (1) a data caching module that (a) caches data reads to one or more of the data storage devices when the number of data reads reaches a data read threshold value, and (b) subsequent to the storage failure detection module detecting the storage failure, prioritizes the caching of data reads to the failed data storage device over the caching of data reads to a data storage device that did not fail, and/or (2) a parity caching module that (a)

Together with the following description, these drawings demonstrate and explain various principles of the instant disclosure.

Figure 1:
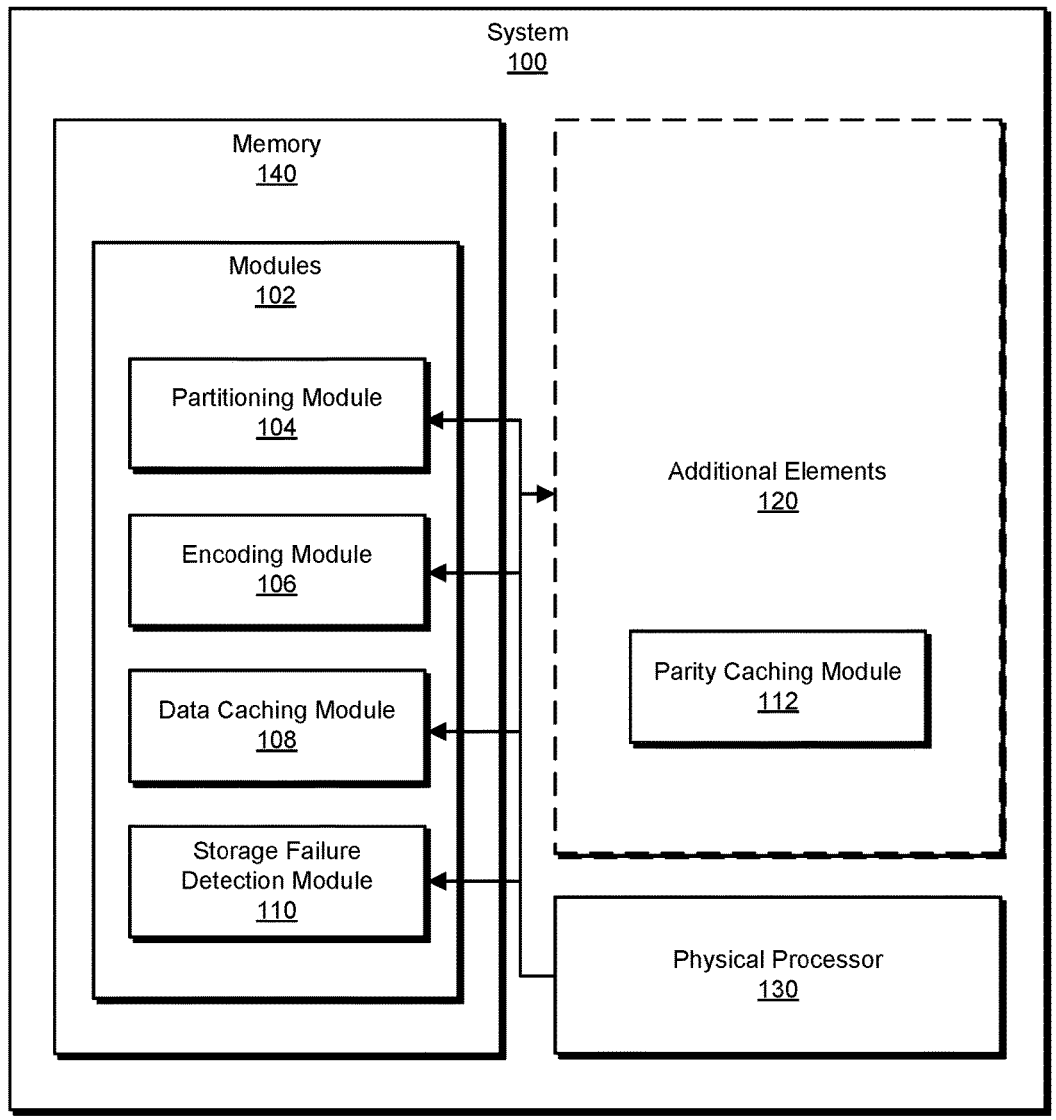
FIG. 1 is a block diagram of an example system for caching in an erasure-coded system.

Throughout the drawings, identical reference characters and descriptions indicate similar, but not necessarily identical, elements. While the example embodiments described herein are susceptible to various modifications and alternative forms, specific embodiments have been shown by way of example in the drawings and will be described in detail herein. However, the example embodiments described herein are not intended to be limited to the particular forms disclosed. Rather, the instant disclosure covers all modifications, equivalents, and alternatives falling within the scope of the appended claims.

DETAILED DESCRIPTION OF EXAMPLE EMBODIMENTS

The present disclosure is generally directed to systems and methods for caching in an erasure-coded system. As will be explained in greater detail below, by providing a caching policy in an erasure-coded system, the various systems and methods described herein may improve the efficiency and performance of redundant array of inexpensive disks ("RAID") systems by reducing network traffic, and latency of read and/or write of parity. Moreover, the systems and methods described herein may improve the functioning and/or performance of the overall network by reducing the amount of network traffic.

The following will provide, with reference to FIGS. 1, 2, 5, and 6, detailed descriptions of example systems for caching in an erasure-coded system. Detailed descriptions of corresponding computer-implemented methods will also be provided in connection with FIGS. 3-5.

Figure 2:
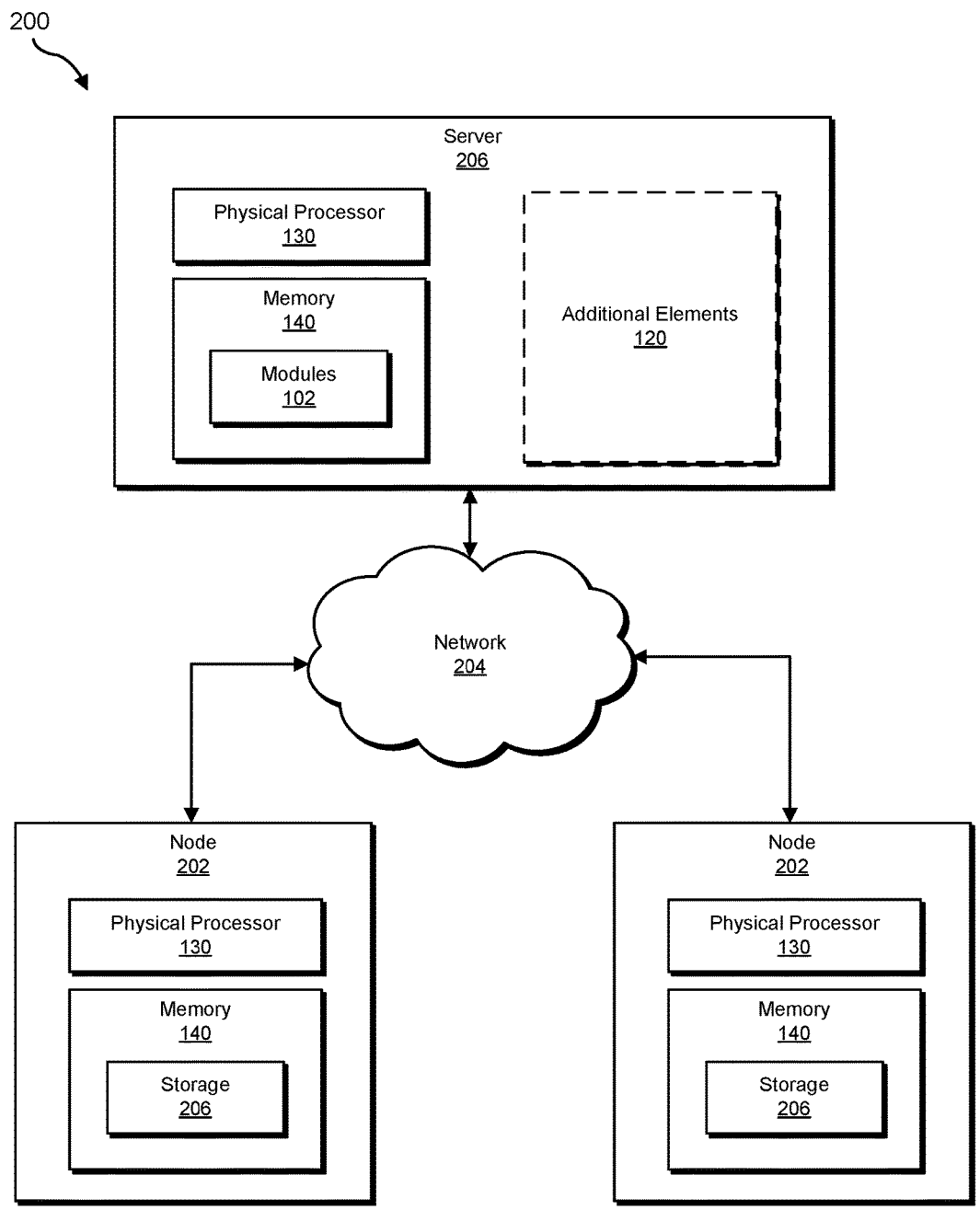
FIG. 2 is a block diagram of an additional example system for caching in an erasure-coded system.
Figure 6:
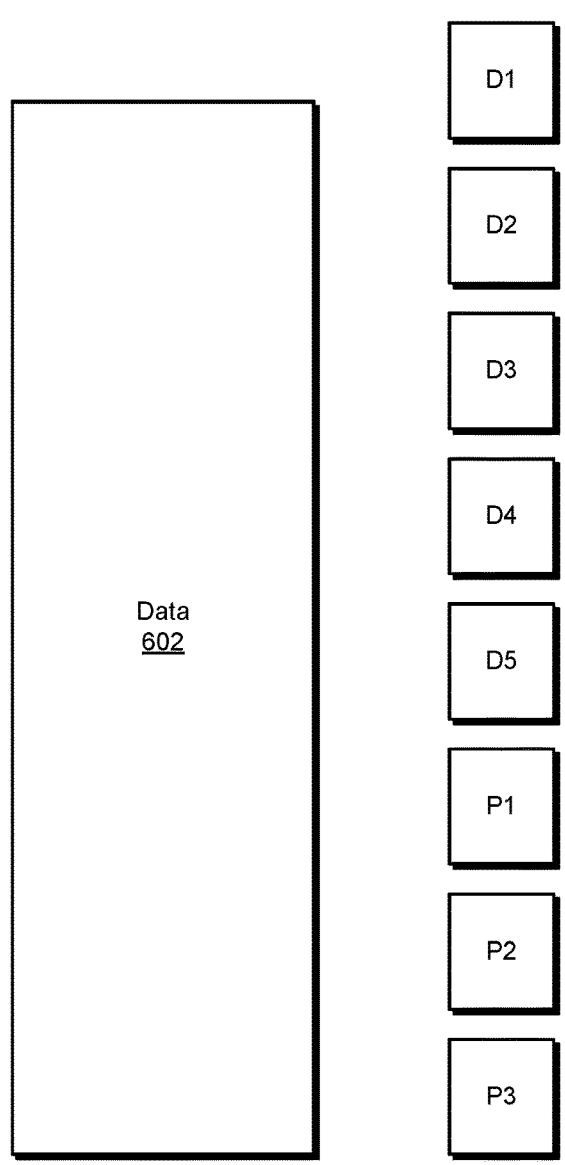
FIG. 6 is a block diagram of an example method for partitioning and encoding data in an erasure-coded system.
Figure 7:
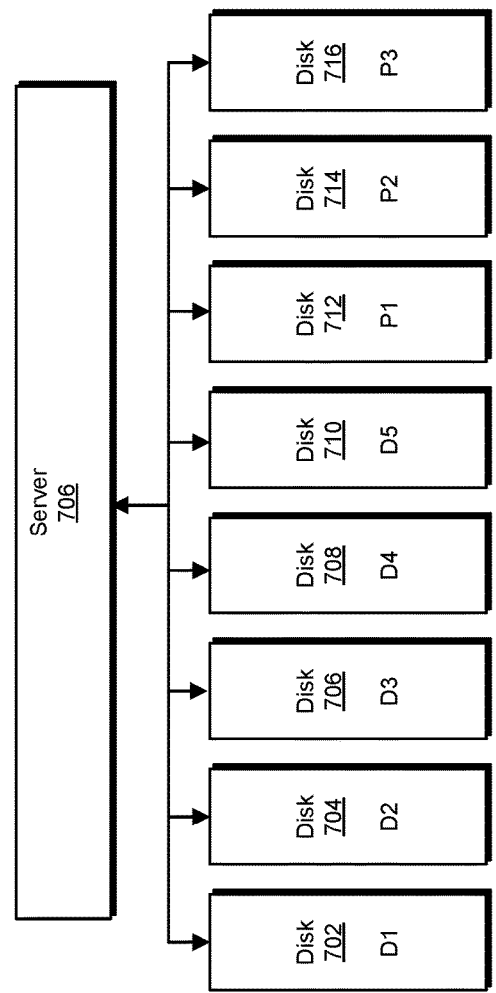
FIG. 7 is a block diagram of another additional example system for encoding data in an erasure-coded system.

FIG. 1 is a block diagram of an example system 100 for caching in an erasure-coded system. As illustrated in this figure, example system 100 may include one or more modules 102 for performing one or more tasks. As will be explained in greater detail below, modules 102 may include a partitioning module 104 that may partition data 402 into chunks of data D1-D5 (FIG. 6), an encoding module 106 that may encode the data chunks D1-D5 into parity chunks P1-P3 (FIG. 6), and a data caching module 108 that may cache data reads to one or more data storage devices 202 (FIG. 2) when the number of data reads reaches a data read threshold value and which, subsequent to a storage failure detection, may prioritize the caching of data reads to the failed data storage device over the caching of data reads to a data storage device that did not fail. System 100 may also include a storage failure detection module 110 that may detect the failure of a data storage device 202, 702-710 (FIGS. 2, 7). Although illustrated as separate elements, one or more of modules 102 in FIG. 1 may represent portions of a single module or application.

In certain embodiments, one or more of modules 102 in FIG. 1 may represent one or more software applications or programs that, when executed by a computing device, may cause the computing device to perform one or more tasks. For example, and as will be described in greater detail below, one or more of modules 102 may represent modules stored and configured to run on one or more computing devices, such as the devices illustrated in FIG. 2 (e.g., node 202 and/or server 206). One or more of modules 102 in FIG. 1 may also represent all or portions of one or more special-purpose computers configured to perform one or more tasks.

As illustrated in FIG. 1, example system 100 may also include one or more memory devices, such as memory 140. Memory 140 generally represents any type or form of volatile or non-volatile storage device or medium capable of storing data and/or computer-readable instructions. In one example, memory 140 may store, load, and/or maintain one or more of modules 102. Examples of memory 140 include, without limitation, Random Access Memory (RAM), Read Only Memory (ROM), flash memory, Hard Disk Drives, (HDDs), Solid-State Drives (SSDs), optical disk drives, caches, variations or combinations of one or more of the same, or any other suitable storage memory.

As illustrated in FIG. 1, example system 100 may also include one or more physical processors, such as physical processor 130. Physical processor 130 generally represents any type or form of hardware-implemented processing unit capable of interpreting and/or executing computer-readable instructions. In one example, physical processor 130 may access and/or modify one or more of modules 102 stored in memory 140. Additionally or alternatively, physical processor 130 may execute one or more of modules 102 to facilitate caching in an erasure-coded system. Examples of physical processor 130 include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

As illustrated in FIG. 1, example system 100 may also include one or more additional elements 120, such as parity caching module 112 that caches local parity writes to the parity storage device, when the number of parity writes reaches a parity threshold value. The parity caching module may also prioritize caching of a parity write corresponding to a partial stripe write to the parity storage device, over a parity write which does not involve a parity read.

Example system 100 in FIG. 1 may be implemented in a variety of ways. For example, all or a portion of example system 100 may represent portions of example system 200 in FIG. 2. As shown in FIG. 2, system 200 may include a node 202 (also referred to herein as computing device) in communication with a server 206 via a network 204. In one example, all or a portion of the functionality of modules 102 may be performed by computing device 202, server 206, and/or any other suitable computing system. As will be described in greater detail below, one or more of modules 102 from FIG. 1 may, when executed by at least one processor of computing device 202 and/or server 206, enable computing device 202 and/or server 206 to realize a preferred caching protocol in an erasure-coded system.

Computing device 202 generally represents any type or form of computing device capable of reading computer-executable instructions. Examples of computing device 202 include, independent hard drives which make up part of a RAID system. Additional examples of computing device 202 include, without limitation, laptops, tablets, desktops, servers, cellular phones, Personal Digital Assistants (PDAs), multimedia players, embedded systems, wearable devices (e.g., smart watches, smart glasses, etc.), smart vehicles, so-called Internet-of-Things devices (e.g., smart appliances, etc.), gaming consoles, variations or combinations of one or more of the same, or any other suitable computing device.

Server 206 generally represents any type or form of computing device that is capable of distributing data across multiple storage devices (whether the storage devices are directly connected to server 206 or connected via a network) and reading data from the various storage devices. An example of server 206 may include the server portion of a RAID system. Additional examples of server 206 include, without limitation, storage servers, database servers, application servers, and/or web servers configured to run certain software applications and/or provide various storage, database, and/or web services. Although illustrated as a single entity in FIG. 2, server 206 may include and/or represent a plurality of servers that work and/or operate in conjunction with one another.

Network 204 generally represents any medium or architecture capable of facilitating communication or data transfer. In one example, network 204 may facilitate communication between computing device 202 and server 206. In this example, network 204 may facilitate communication or data transfer using wireless and/or wired connections. Examples of network 204 include, without limitation, an intranet, a Wide Area Network (WAN), a Local Area Network (LAN), a Personal Area Network (PAN), the Internet, Power Line Communications (PLC), a cellular network (e.g., a Global System for Mobile Communications (GSM) network), portions of one or more of the same, variations or combinations of one or more of the same, or any other suitable network.

Many other devices or subsystems may be connected to computing system 100 in FIG. 1 and/or computing system 200 in FIG. 2. Conversely, all of the components and devices illustrated in FIGS. 1 and 2 need not be present to practice the embodiments described and/or illustrated herein. The devices and subsystems referenced above may also be interconnected in different ways from that shown in FIG. 2. Computing systems 100 and 200 may also employ any number of software, firmware, and/or hardware configurations. For example, one or more of the example embodiments disclosed herein may be encoded as a computer program (also referred to as computer software, software applications, computer-readable instructions, and/or computer control logic) on a computer-readable medium.

The term "computer-readable medium," as used herein, generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The term "disk" as used herein, generally refers to any medium used to store data. In one or more embodiments, a disk may include a physical disk. Examples of disks include, without limitation, optical disks, magnetic disks, analog disks, and/or any other suitable storage media. In one or more examples, the term disk may be used interchangeably with the term storage device, column or "node" which refers to an independent device which has storage, caching capabilities and hardware and/or software for communicating with the server and capable of interpreting and/or executing computer-readable instructions. A single disk may be deemed multiple storage devices by partitioning the disk into multiple virtual storage devices.

The term "stripe" as used herein, generally refers to partitioned data that is distributed across multiple disks.

The term "cache" as used herein, generally refers to a hardware or software component for storing information which can be accessed quickly. Examples of caches include, without limitation, a block of memory for temporary storage of information that is stored in more permanent storage such as a disk.

The term "reaches a threshold" (or some specified threshold), as used herein, generally refers to equal to or greater than the threshold. By way of example, if a threshold is 10 then reaches the threshold may require obtaining the value of 10 or it may require exceeding the value of 10 as the circumstances dictate or as the system design dictates.

The term "encoding," as used herein, generally refers to calculating through the use of a formula.

The term "throughput," as used herein, generally refers to any measurement of information transfer to or from a disk. In one or more embodiments, throughput may refer to the scale of input/output operations the disk is capable of or is handling.

Figure 3:
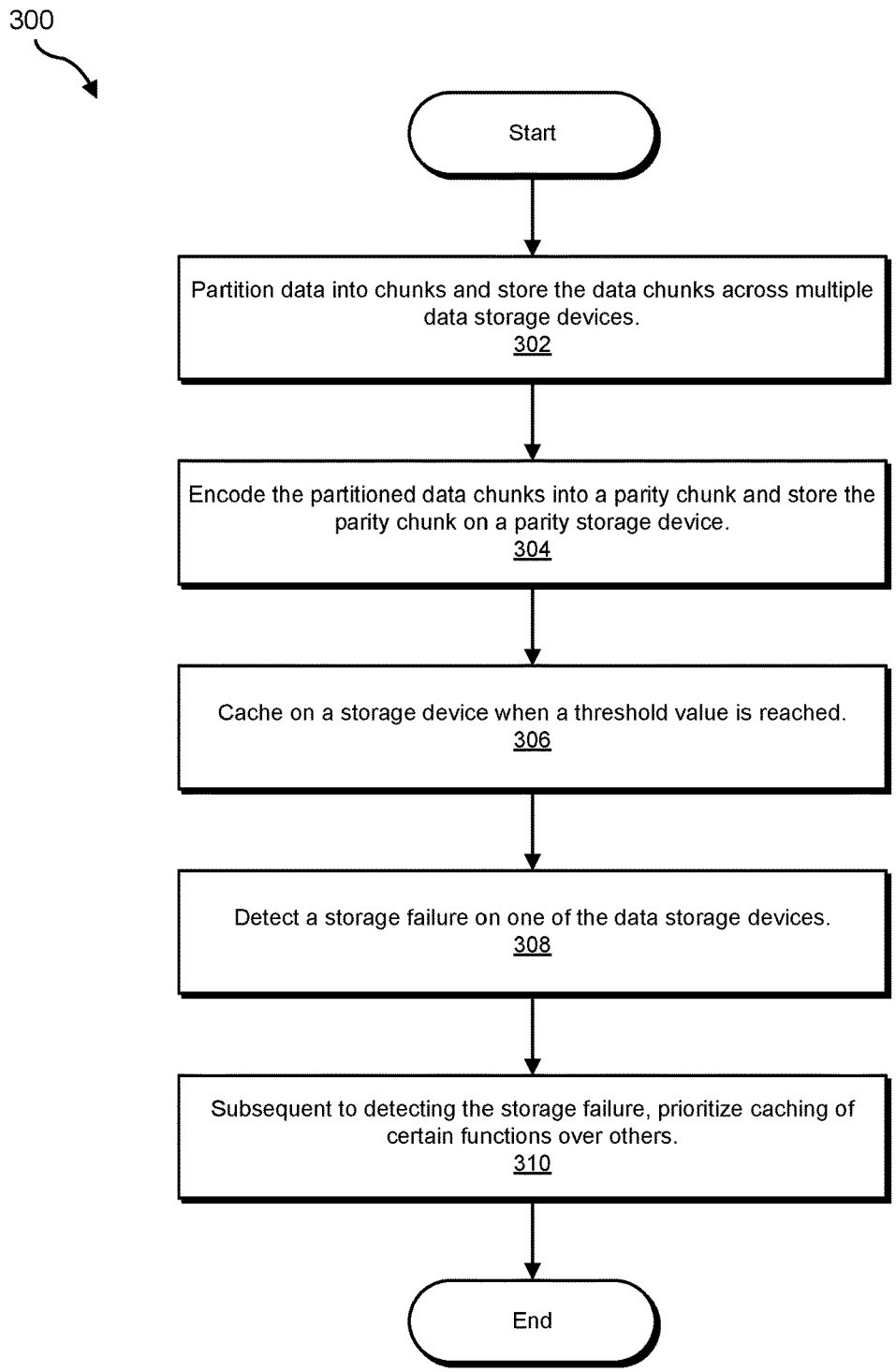
FIG. 3 is a flow diagram of an example method for caching in an erasure-coded system.
Figure 4:
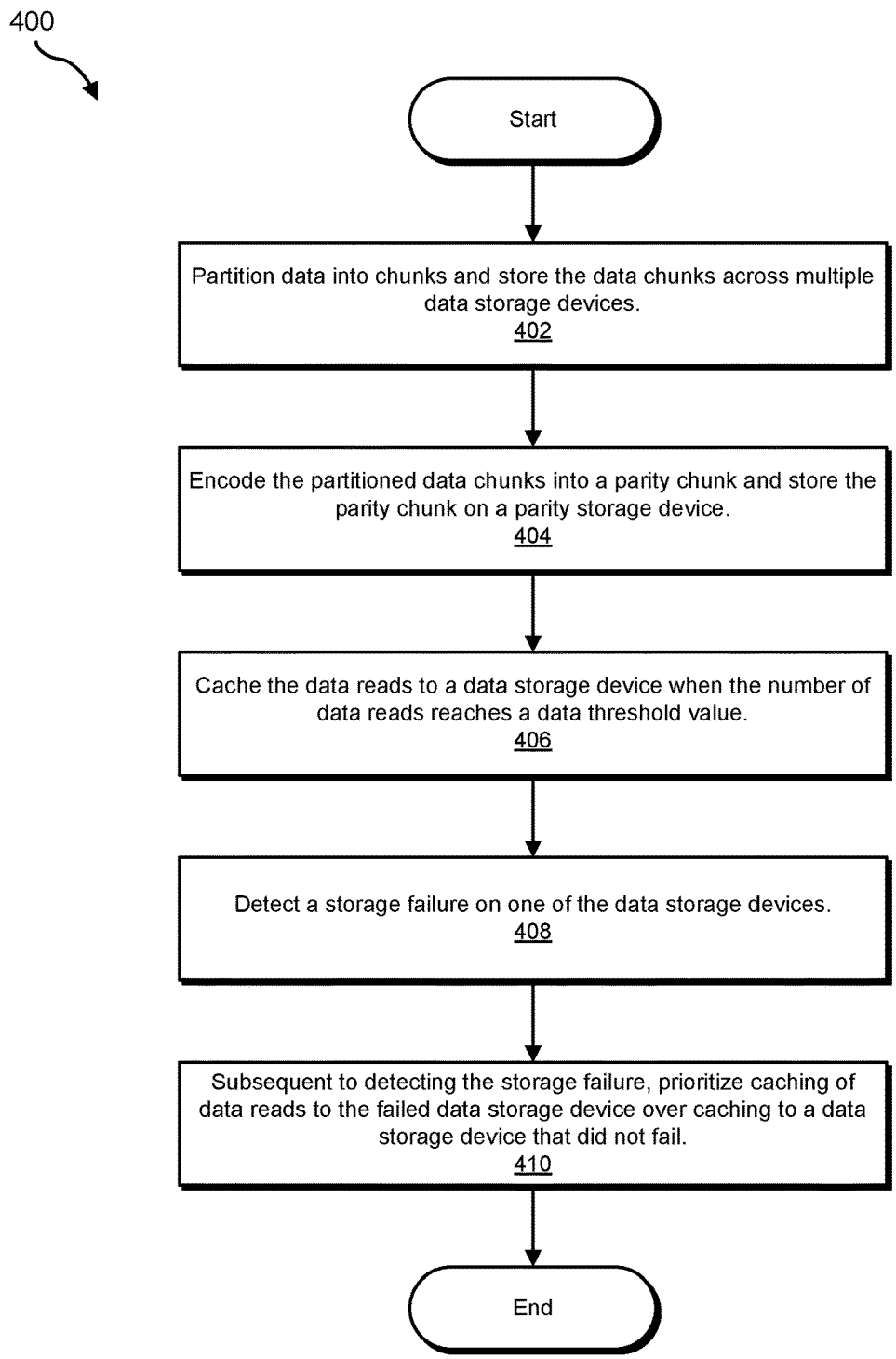
FIG. 4 is a flow diagram of another example method for caching in an erasure-coded system.
Figure 5:
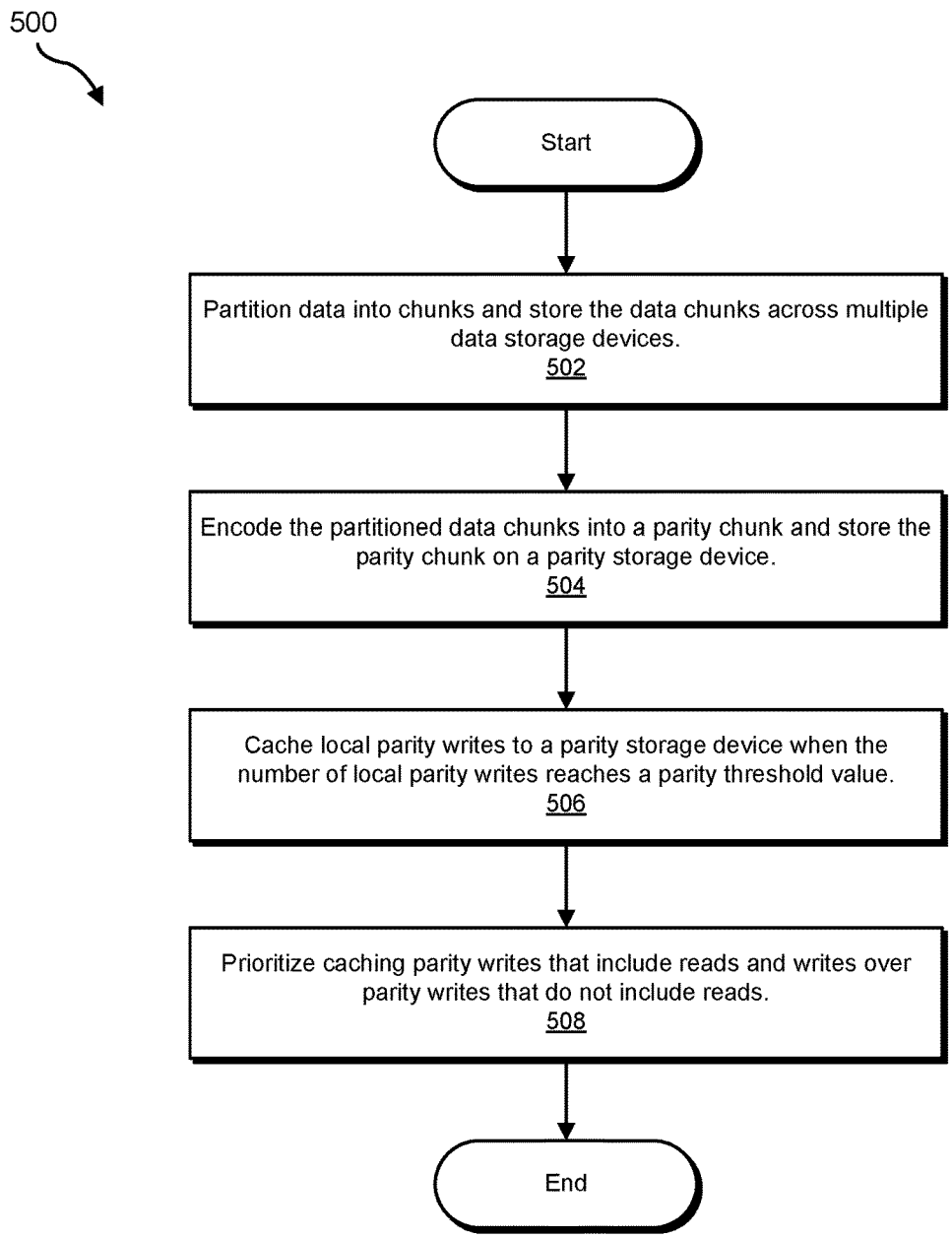
FIG. 5 is a flow diagram of yet another example method for caching in an erasure-coded system.

FIGS. 3-5 are flow diagrams of exemplary computer-implemented methods 300, 400 and 500 for caching in an erasure-coded system. While the various steps are numbered in the figures, this numbering scheme is for descriptive purposes only and is not intended to be limiting as to a required order to the steps. The steps shown in FIGS. 3-5 may be performed by any suitable computer-executable code and/or computing system, including system 100 in FIG. 1, system 200 in FIG. 2, system 700 in FIG. 7, and/or variations or combinations of one or more of the same. In one example, each of the steps shown in FIGS. 3-5 may represent an algorithm whose structure includes and/or is represented by multiple sub-steps, examples of which will be provided in greater detail below.

As illustrated in FIGS. 3-5, one or more of the systems described herein may reduce network traffic and improve throughput using a caching policy for erasure-coded systems. For example, as illustrated at steps 302, 402 and 502 partitioning module 104 may, as part of server 200 in FIG. 2, partition data 602 (FIG. 6) into k data chunks (D1-D5, FIG. 6) and store the data chunks across distributed storage subsystems called failure domains (interchangeably referred to as Disk 702-76 in FIG. 7 and Node 202 in FIG. 2 and storage device). While FIG. 2 illustrates only 2 nodes 202, FIG. 6 illustrates the data 602 partitioned into 5 chunks (D1-D5) and FIG. 7 illustrates the data D1-D5 being distributed over 5 storage devices 702-710, this is merely for illustrative purposes. Those skilled in the art will recognize that there could be fewer than 5 data chunks and fewer than 5 data storage devices or more than 5 data chunks and more than 5 data storage devices and still fall within a scope of one or more of the claims that follow.

Partitioning module 104 may partition and store data chunks in any suitable manner. For example, partition module 104 may take a balanced approach in which case it will partition the data into the same number of chunks as there are storage devices (e.g. if there are 5 storage devices, partition module 104 will separate the data into 5 parts and store one chunk on each storage device) and each storage device will contain the same ratio of data. The data parts may be stored in order or out of order. Partition module 104 may alternatively take a more random approach in which case the data may be separated into fewer chunks than there are storage devices and each storage device need not contain the same ration of data. To maintain maximum distance separation between data chunks, the chunks may be multiplied by a coefficient such as a Reed-Solomon coefficient. Those skilled in the art will recognize that other coefficients may be employed without departing from scope of one or more claims. The actual size of the data chunk size may affect performance of the system, thus the chunk size may be determined based on a knowledge about the workload presented to the disk system.

At step 304 of FIG. 3, 404 of FIG. 4 and 504 of FIG. 5 the data chunks may be encoded into parity chunks and stored. For example, encoding module 106 may, as part of server 200 in FIG. 2, encode the k data chunks into m parity chunks (P1-P3, FIG. 6) and store the parity chunks across distributed failure domains. While FIG. 2 illustrates only 2 nodes 202, FIG. 6 illustrates the 5 data chunks (D1-D5) encoded into 3 parity chunks P1-P3 and FIG. 7 illustrates the parity P1-P3 being distributed over 3 storage devices 712-716, this is merely for illustrative purposes. Those skilled in the art will recognize that there could be fewer than 5 parity chunks and fewer than 5 parity storage devices or more than 3 parity chunks and more than 3 data storage devices and still fall within a scope of one or more of the claims that follow.

Encoding module 106 may encode the data chunks into parity chunks in any suitable manner. For example, if the data is separated into k data chunks then encoding module 106 may encode the data into m parity chunks by multiplying each data chunk by a coefficient, such as a Reed-Solomon coefficient (or any other suitable coefficient), then encoding module 106 may apply an exclusive or ("XOR") to combine each of the data chunks into a parity chunk as follows:

$$P1 = D_1 a_1 + D_2 a_2 + \ldots + D_k a_k$$

$$P2 = D_1 b_1 + D_2 b_2 + \ldots + D_k b_k$$

$$\ldots$$

$$P_m = D_1 m_1 + D_2 m_2 + \ldots + D_k m_k$$

In this example, "D" is a data chunk, "a-m" are Reed-Solomon coefficients (or some other suitable coefficient,) "+" is an XOR function and "P" is the parity chunk.

At step 406 of FIG. 4 data reads are cached when the number of reads to a storage device reaches a threshold. Data caching module 108 may, as part of server 200 in FIG. 2, monitor the access pattern of a data storage device and when the number of reads to that storage device reaches (meets or exceeds) the threshold, data caching module 106 will cache the data reads to that data storage device. Those skilled in the art will recognize that data caching module 106 may be centrally located at the server or may be incorporated entirely or partially into the node 202.

The threshold level for caching may be a design choice and may be different for different caching functions. For instance, the threshold level for caching data reads may be different than the threshold level for caching parity reads and writes. The reason for using a threshold value may be to ensure that data reads will be cached faster during reconstruction since there will be more reads than during normal operation. The same holds true for parity read/writes. During reconstruction and or during a partial update, parity will read and write more often. Thus, having a threshold value ensures that parity read/writes are cached faster than just parity reads that do not include parity writes.

At step 308 of FIG. 3, and 408 of FIG. 4 a storage failure is detected. Storage failure detection module 110 may, as part of server 200 in FIG. 2, detect failures of one or more storage devices and place the system into degraded mode. In degraded mode, at step 410 of FIG. $, data reads that are cached at the failed node are prioritized over data reads that are cached at nodes that have not failed. The data caching module 108 may, as part of server 200 in FIG. 2, prioritize caching the data reads to the failed data storage device. Data reads for reconstructing a node may occur more often than data reads for a non-failed node. As such, the data reads associated with reconstructing a failed node may reach the caching threshold faster than reads to nodes which have not failed and as such will be cached sooner than data reads at a normal node.

Storage failure detection module 106 may detect a storage failure in any suitable manner. For example, most modern day RAID systems rely on the on-disk controllers to signal the RAID controller that they are in distress through Self-Monitoring, Analysis, and Reporting Technology ("SMART") or the like.

As explained above, in connection with FIGS. 1, 2, 6, and 7 a read/write caching policy for erasure-coded system may be provided to reduce network traffic and to improve throughput by reducing read/write latency of parity. Consider an erasure-coded system created over a flexible storage sharing ("FSS") cluster such that caching (read-write through or read-write back) is enabled on one or more nodes. A caching policy that is based on the status of the system (i.e. normal or degraded) and/or an access pattern of parity updates may reduce network traffic and improve throughput.

In normal mode, the nodes on which data resides will cache the data based on the data access pattern. The data which is frequently read (based on threshold value) will be cached. In a preferred embodiment, only reads will be cached. In other examples, a system that implements the features herein may also cache some or all writes and still fall within a scope of one or more claims. At steps 506 and 507 of FIG. 5, the nodes on which parity resides may cache local parity writes based on the local parity write access pattern. Updates on parity which involve read and write may have a higher priority for caching over updates which only involves writes. Parity updates that involve both read and write may be cached once the number of such updates reaches a specified threshold. The threshold value may be higher for updates involving only writes. However, if the caching is write-through, then updates of write only parity may not be cached.

In degraded mode, the reads on faulted data storage devices may be given higher preference/weighting for caching than reads on non-faulted storage devices (Step 410 of FIG. 4). Reconstruction reads need k data chunks to be read. Thus, if a faulted stripe is accessed n times then it is likely accessed kn times due to the number of storage devices across which the data is stored. As a result, reconstruction reads may be cached earlier compared to normal reads. This scheme results in a high probability that a frequently accessed faulted storage device's data is already cached, which means that there is no need to send data over the network for reconstruction of that drive. Thus, network traffic during reconstruction is diminished.

On the parity nodes, the caching policy may be same as it is in normal mode. If multiple nodes are frequently writing to the same stripe, then there may be more updates on parity compared to the corresponding data columns. Since the disclosed caching mechanism provides for high volume parity uses and updates to be cached locally on a parity node, reads and writes to parity may be served faster resulting in faster updates and improved throughput of the system. For example, if a parity region is read and written during a partial update, it is accessed two times. If it is accessed n times in a partial update it is likely accessed 2n times as per the disclosed policy. This may ensure that these regions are cached sooner, which reduces the partial write latency as parity data will be accessed from the cache.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered example in nature since many other architectures can be implemented to achieve the same functionality.

In some examples, all or a portion of example system 100 in FIG. 1 may represent portions of a cloud-computing or network-based environment. Cloud-computing environments may provide various services and applications via the Internet. These cloud-based services (e.g., software as a service, platform as a service, infrastructure as a service, etc.) may be accessible through a web browser or other remote interface. Various functions described herein may be provided through a remote desktop environment or any other cloud-based computing environment.

In various embodiments, all or a portion of example system 100 in FIG. 1 may facilitate multi-tenancy within a cloud-based computing environment. In other words, the modules described herein may configure a computing system (e.g., a server) to facilitate multi-tenancy for one or more of the functions described herein. For example, one or more of the modules described herein may program a server to enable two or more clients (e.g., customers) to share an application that is running on the server. A server programmed in this manner may share an application, operating system, processing system, and/or storage system among multiple customers (i.e., tenants). One or more of the modules described herein may also partition data and/or configuration information of a multi-tenant application for each customer such that one customer cannot access data and/or configuration information of another customer.

According to various embodiments, all or a portion of example system 100 in FIG. 1 may be implemented within a virtual environment. For example, the modules and/or data described herein may reside and/or execute within a virtual machine. As used herein, the term "virtual machine" generally refers to any operating system environment that is abstracted from computing hardware by a virtual machine manager (e.g., a hypervisor).

In some examples, all or a portion of example system 100 in FIG. 1 may represent portions of a mobile computing environment. Mobile computing environments may be implemented by a wide range of mobile computing devices, including mobile phones, tablet computers, e-book readers, personal digital assistants, wearable computing devices (e.g., computing devices with a head-mounted display, smartwatches, etc.), variations or combinations of one or more of the same, or any other suitable mobile computing devices. In some examples, mobile computing environments may have one or more distinct features, including, for example, reliance on battery power, presenting only one foreground application at any given time, remote management features, touchscreen features, location and movement data (e.g., provided by Global Positioning Systems, gyroscopes, accelerometers, etc.), restricted platforms that restrict modifications to system-level configurations and/or that limit the ability of third-party software to inspect the behavior of other applications, controls to restrict the installation of applications (e.g., to only originate from approved application stores), etc. Various functions described herein may be provided for a mobile computing environment and/or may interact with a mobile computing environment.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

While various embodiments have been described and/or illustrated herein in the context of fully functional computing systems, one or more of these example embodiments may be distributed as a program product in a variety of forms, regardless of the particular type of computer-readable media used to actually carry out the distribution. The embodiments disclosed herein may also be implemented using modules that perform certain tasks. These modules may include script, batch, or other executable files that may be stored on a computer-readable storage medium or in a computing system. In some embodiments, these modules may configure a computing system to perform one or more of the example embodiments disclosed herein.

The preceding description has been provided to enable others skilled in the art to best utilize various aspects of the example embodiments disclosed herein. This example description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A computer-implemented method for caching in an erasure-coded system, at least a portion of the method being performed by a computing device comprising at least one processor, the method comprising:
partitioning data into a plurality of data chunks and storing the plurality of partitioned data chunks across at least two data storage devices;

encoding the plurality of partitioned data chunks into at least one parity chunk and storing the at least one parity chunk on at least one parity storage device;

in a normal mode:

for each of the at least two data storage devices, caching data reads to the data storage device when a number of reads to the data storage device reaches a data read threshold; and for the parity storage device, caching local parity writes to the parity storage device when a number of local parity writes reaches a parity threshold value and prioritizing caching parity writes that include reads and writes over parity writes that do not include reads; and in a degraded mode, initiated in response to detecting a storage failure on one of the at least two data storage devices:

for the at least two data storage devices, prioritizing the caching of the data reads to the data storage device that failed over data storage devices that did not fail; and for the parity storage device, continuing to cache local parity writes to the parity storage device when a number of local parity writes reaches a parity threshold value and prioritize caching parity writes that include reads and writes over parity writes that do not include reads.

2. The computer-implemented method according to claim 1, further comprising:

identifying a plurality of local parity writes to the parity storage device;

determining that a number of the local parity writes reaches the parity threshold value; and in response to determining that the number of the local parity writes reaches the parity threshold value, caching the local parity writes to the parity storage device.

3. The computer-implemented method according to claim 2, further comprising:

prioritizing the caching of a parity write corresponding to a partial stripe write to the parity storage device over the caching of a parity write that does not involve a parity read.

4. The computer-implemented method according to claim 1, wherein the at least two data storage devices comprise more than two data storage devices.

5. The computer-implemented method according to claim 4, further comprising caching the data reads to two of the at least two data storage devices.

6. The computer-implemented method according to claim 1, further comprising encoding the plurality of partitioned data chunks into a plurality of parity chunks and storing the plurality of parity chunks on a plurality of parity storage devices.

7. The computer-implemented method according to claim 1, wherein at least one of the at least two data storage devices and the at least one parity storage device comprise a same storage device.

8. A system for caching in an erasure-coded system, which includes at least a cache and a plurality of storage devices, the system comprising:

a partitioning module, stored in memory, that partitions data into a plurality of data chunks and stores the plurality of partitioned data chunks across at least two data storage devices;

an encoding module, stored in memory, that encodes the plurality of partitioned data chunks into at least one parity chunk and stores the at least one parity chunk on at least one parity storage device;

a caching module, stored in memory, that:

in a normal mode:

for each of the at least two data storage devices, caches data reads to the data storage device when a number of reads to the data storage device reaches a data read threshold; and for the parity storage device, caches local parity writes to the parity storage device when a number of local parity writes reaches a parity threshold value and prioritizes caching parity writes that include reads and writes over parity writes that do not include reads; and in a degraded mode, initiated in response to detecting a storage failure on one of the at least two data storage devices:

for the at least two data storage devices, prioritizes the caching of the data reads to the data storage device that failed over data storage devices that did not fail; and for the parity storage device, continues to cache local parity writes to the parity storage device when a number of local parity writes reaches a parity threshold value and prioritize caching parity writes that include reads and writes over parity writes that do not include reads.

9. The system according to claim 8, wherein the caching module is further configured to:

identify a plurality of local parity writes to the parity storage device;

determine that a number of the local parity writes reaches the parity threshold value; and in response to determining that the number of the local parity writes reaches the parity threshold value, cache the local parity writes to the parity storage device.

10. The system according to claim 9, wherein the caching module prioritizes caching of a parity write corresponding to a partial stripe write to the at least one parity storage device over a parity write which does not involve a parity read.

11. The system according to claim 10, wherein the data caching module caches a plurality of data reads to two of the at least two data storage devices.

12. The system according to claim 8, wherein the partitioning module stores the plurality of partitioned data chunks on more than two data storage devices.

13. The system according to claim 8, wherein the encoding module encodes the plurality of partitioned data chunks into a plurality of parity chunks and stores the plurality of parity chunks on a plurality of parity storage devices.

14. The system according to claim 8, wherein the partitioning module and the encoding module respectively store the plurality of partitioned data chunks and the at least one parity chunk on a common storage device.

15. A non-transitory computer-readable medium comprising one or more computer-executable instructions that, when executed by at least one processor of a computing device, cause the computing device to:

partition data into a plurality of data chunks and store the plurality of partitioned data chunks across at least two data storage devices;

encode the plurality of partitioned data chunks into at least one parity chunk and store the at least one parity chunk on at least one parity storage device;

in a normal mode:

for each of the at least two data storage devices, cache data reads to the data storage device when a number of reads to the data storage device reaches a data read threshold; and for the at least one parity storage device, cache local parity writes to the parity storage device when a number of local parity writes reaches a parity threshold value and prioritize caching parity writes that include reads and writes over parity writes that do not include reads; and in a degraded mode, initiated in response to detecting a storage failure on one of the at least two data storage devices:

for the at least two data storage devices, prioritize the caching of the data reads to the data storage device that failed over data storage devices that did not fail; and for the at least one parity storage device, continue to cache local parity writes to the parity storage device when a number of local parity writes reaches a parity threshold value and prioritize caching parity writes that include reads and writes over parity writes that do not include reads.

16. The non-transitory computer-readable medium according to claim 15, wherein the instructions further cause the computing device to:

identify a plurality of local parity writes to the parity storage device;

determine that a number of the local parity writes reaches the parity threshold value; and in response to determining that the number of the local parity writes reaches the parity threshold value, cache the local parity writes to the parity storage device.

17. The non-transitory computer-readable medium according to claim 16, wherein the one or more computer-executable instructions cause the computing device to cache a plurality of data reads on two of the at least two data storage devices.

18. The non-transitory computer-readable medium according to claim 15, wherein the instructions further cause the computing device to prioritize caching of a parity write corresponding to a partial stripe write to the at least one parity storage device over a parity write which does not involve a parity read.

19. The non-transitory computer-readable medium according to claim 15, wherein the one or more computer-executable instructions cause the computing device to encode the plurality of partitioned data chunks into a plurality of parity chunks and store the plurality of parity chunks on a plurality of parity storage devices.

20. The non-transitory computer-readable medium according to claim 15, wherein the one or more computer-executable instructions cause the computing device to store the plurality of partitioned data chunks and the at least one parity chunk on a common storage device.

* * * * *